(12) United States Patent
Kim et al.

(10) Patent No.: US 9,327,312 B2
(45) Date of Patent: May 3, 2016

(54) RESIN COATING APPARATUS AND A METHOD FOR FORMING A RESIN LAYER USING THE SAME

(71) Applicant: SAMSUNG DISPLAY CO., LTD., Yongin, Gyeonggi-do (KR)

(72) Inventors: Young-Sik Kim, Cheonan-si (KR); Jun-Ho Kwack, Chungcheongnam-do (KR); Young-In Lim, Cheonan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 125 days.

(21) Appl. No.: 14/067,245

(22) Filed: Oct. 30, 2013

(65) Prior Publication Data

US 2014/0374014 A1 Dec. 25, 2014

(30) Foreign Application Priority Data

Jun. 20, 2013 (KR) ........................ 10-2013-0070994

(51) Int. Cl.
| | |
|---|---|
| *B05C 5/02* | (2006.01) |
| *B05D 1/34* | (2006.01) |
| *G06F 3/00* | (2006.01) |
| *B32B 37/24* | (2006.01) |
| *H01L 51/52* | (2006.01) |
| *G06F 3/041* | (2006.01) |
| *B05D 1/26* | (2006.01) |
| *B05C 9/06* | (2006.01) |

(52) U.S. Cl.
CPC . *B05D 1/34* (2013.01); *B32B 37/24* (2013.01); *G06F 3/00* (2013.01); *G06F 3/041* (2013.01); *H01L 51/5253* (2013.01); *B05C 5/0204* (2013.01); *B05C 5/027* (2013.01); *B05C 9/06* (2013.01); *B05D 1/26* (2013.01); *B32B 2037/243* (2013.01); *B32B 2457/20* (2013.01); *G06F 2203/04103* (2013.01); *Y10T 156/10* (2015.01)

(58) Field of Classification Search
CPC ........ B05C 5/02; B05C 5/0204; B05C 5/027; B05C 5/0275; B05C 5/0279
USPC ......................................................... 118/315
See application file for complete search history.

(56) References Cited

U.S. PATENT DOCUMENTS

| | | | | |
|---|---|---|---|---|
| 5,776,643 | A * | 7/1998 | Hirai ................................ | 430/7 |
| 6,458,208 | B1 * | 10/2002 | Anai et al. ....................... | 118/52 |
| 2010/0223957 | A1 * | 9/2010 | Moon ...................... | C03B 18/16 65/182.3 |
| 2010/0285209 | A1 | 11/2010 | Tateishi | |
| 2010/0302296 | A1 | 12/2010 | Ito et al. | |

FOREIGN PATENT DOCUMENTS

| | | |
|---|---|---|
| JP | 2003-005208 | 1/2003 |
| KR | 1020060128709 | 12/2006 |
| KR | 1020100129188 | 12/2010 |

* cited by examiner

*Primary Examiner* — Scott W Dodds
(74) *Attorney, Agent, or Firm* — F. Chau & Associates, LLC

(57) ABSTRACT

A resin coating apparatus includes a display panel disposed on a stage. A plurality of nozzles correspond to the display panel. The nozzles have a plurality of outlets configured to discharge a first resin and a second resin to the display panel. The second resin has different viscosity from the first resin. A connecting member holds the plurality of nozzles. A first supply unit is connected to the nozzles, and the first supply unit is configured to supply the first resin. The second supply unit is connected to the nozzles, and the second supply unit is configured to supply the second resin.

9 Claims, 6 Drawing Sheets

RESIN COATING APPARATUS AND A METHOD FOR FORMING A RESIN LAYER USING THE SAME

CROSS-REFERENCE TO RELATED APPLICATION

This application claims priority under 35 U.S.C. §119 to Korean Patent Application No. 10-2013-0070994, filed on Jun. 20, 2013, in the Korean Intellectual Property Office (KIPO), the disclosure of which is incorporated by reference herein in its entirety.

TECHNICAL FIELD

Exemplary embodiments of the present invention relate to a resin coating apparatus and a method for forming a resin layer using the same. More particularly, exemplary embodiments of the present invention relate to a resin coating apparatus for manufacturing a flat display device by using two kinds of resins which have different properties to bond a touch panel or a window panel to the display panel.

DISCUSSION OF THE RELATED ART

A flat panel display device is a display element which displays an image by controlling light. The flat panel display device is used in various electronic devices and various industrial fields because it has various features such as lightness, compact size, high resolution, large screen size, and low power consumption. The flat panel display device may be divided into a liquid crystal display device (LCD), a plasma display panel (PDP) or an organic light emitting diode display (OLED) depending on a type of display panel used.

To manufacture the flat panel display device, a process for bonding the display panel to a touch panel (or a window panel) is performed. In the bonding process, a resin is coated on the display panel and the touch panel (or the window panel) is bonded on the display panel. The resin is then hardened by exposure to an ultraviolet ray or heat.

In the process for coating the resin on the display panel, when a viscosity of the resin is low, the resin may be non-uniformly dispersed on the display panel. Further, the resin may overflow off of the display panel. In this case, the display panel and the touch panel (or the window panel) might not be suitably bonded and thus the flat panel display device may have poor display quality. On the other hand, when a viscosity of the resin is high, the resin may not be suitably dispersed on the material on which it is coated.

SUMMARY

Exemplary embodiments of the present invention provide a resin coating apparatus capable of forming a resin layer having a uniform thickness on a display panel.

Exemplary embodiments of the present invention provide a method of a resin coating apparatus capable of forming a resin layer having a uniform thickness on a display panel by using a resin coating apparatus.

Exemplary embodiments of the present invention provide a method for forming a first resin layer capable of forming a second resin layer having a uniform thickness on a display panel.

According to exemplary embodiments of the present invention, a resin coating apparatus includes display panel disposed on a stage. A plurality of nozzles correspond to the display panel. The nozzles have a plurality of outlets configured to discharge a first resin and a second resin to the display panel. The second resin has a different viscosity from a viscosity of the first resin. A connecting member holds the nozzles. A first supply unit is connected to the nozzles, and the first supply unit is configured to discharge the first resin. The second supply unit is connected to the nozzles, and the second supply unit is configured to discharge the second resin.

In an exemplary embodiment of the present invention, the display panel may be bonded with a cover member.

In an exemplary embodiment of the present invention, the nozzles may be connected to the first supply unit or the second supply unit through pipes.

In an exemplary embodiment of the present invention, the connecting member may comprise an insert hole into which the plurality of nozzles are inserted.

In an exemplary embodiment of the present invention, the number of the nozzles may be n, and the first nozzle and the $n^{th}$ nozzle of the plurality of nozzles may be connected to the first supply unit through a pipe and the first nozzle and the $n^{th}$ nozzle of the plurality of nozzles may be configured to discharge the first resin onto the display panel.

In an exemplary embodiment of the present invention, the number of the plurality of nozzles may be n, and the second to the $(n-1)^{th}$ nozzle of the plurality of nozzles may be connected to the second supply unit through a pipe. The second nozzle and the $(n-1)^{th}$ nozzle may be configured to discharge the second resin to the display panel.

In an exemplary embodiment of the present invention, the first resin may have higher viscosity than the viscosity of the second resin.

In an exemplary embodiment of the present invention, the plurality of nozzles may be arranged in a row.

In exemplary embodiments of the present invention, a method of coating a resin is provided as follows. A display panel is disposed between a plurality of nozzles and a stage. The nozzles are connected to a first supply unit and a second supply unit. A first resin is supplied to the first supply unit and the second resin is supplied to a second supply unit. The second resin has a different viscosity from the viscosity of the first resin. The first resin and the second resin are discharged onto the display panel through the nozzles by moving a connecting member which holds the nozzles across a surface of the display panel to coat the first resin and the second resin on the display panel. A cover member is bonded on the display panel on which the first resin and the second resin are coated. The first resin and the second resin are hardened.

In an exemplary embodiment of the present invention, the display panel may be disposed apart from the connecting member.

In an exemplary embodiment of the present invention, the first supply unit is connected to a first nozzle and a last nozzle of the nozzles and the first supply unit supplies the first resin to the first nozzle and the last nozzle. The second supply unit is connected to a second nozzle and a next to last nozzle of the nozzles and the second supply unit supplies the second resin to the second nozzle and the next to last nozzle.

In an exemplary embodiment of the present invention, the connecting member is disposed apart from the display panel. The connecting member may be transported in a longitudinal direction and a horizontal direction of the display panel so that the first and second resins are coated on the display panel.

In an exemplary embodiment of the present invention, the first resin and the second resins may be hardened by an ultraviolet ray.

In an exemplary embodiment of the present invention, the first resin and the second resin may be hardened by heat.

In an exemplary embodiment of the present invention, the cover member may comprise a touch panel or a window panel.

In exemplary embodiments of the present invention, a method for forming a resin layer is provided as follows. A first resin is coated on a peripheral region of a display panel and a second resin is coated on a central region of the display panel. The second resin has different viscosity from the viscosity of the first resin. A dam is formed with the first resin on a peripheral region of the display panel. The second resin is discharged inside the dam. The second resin layer is formed at the same height of the dam.

In an exemplary embodiment of the present invention, the first resin may have higher viscosity than the viscosity of the second resin.

In an exemplary embodiment of the present invention, the first and second resins may be coated at the same time.

In an exemplary embodiment of the present invention, a resin coating apparatus includes a connecting member suspended above a stage, the stage configured to support a display panel, the connecting member comprising a plurality of nozzles configured to discharge a first resin and a second resin onto the display panel. The plurality of nozzles may comprise first nozzles and second nozzles, the first nozzles disposed on a peripheral region of the connecting member, and the second nozzles disposed on a central region of the connecting member. And, the first nozzles may discharge the first resin having a first viscosity and the second nozzles discharge the second resin having a second viscosity.

In an exemplary embodiment of the present invention, the first resin may have higher viscosity than the viscosity of the second resin.

BRIEF DESCRIPTION OF THE DRAWINGS

The above and other features of the present invention will become more apparent by describing in detail exemplary embodiments thereof, with reference to the accompanying drawings.

DETAILED DESCRIPTION OF THE EMBODIMENTS

Figure 1:
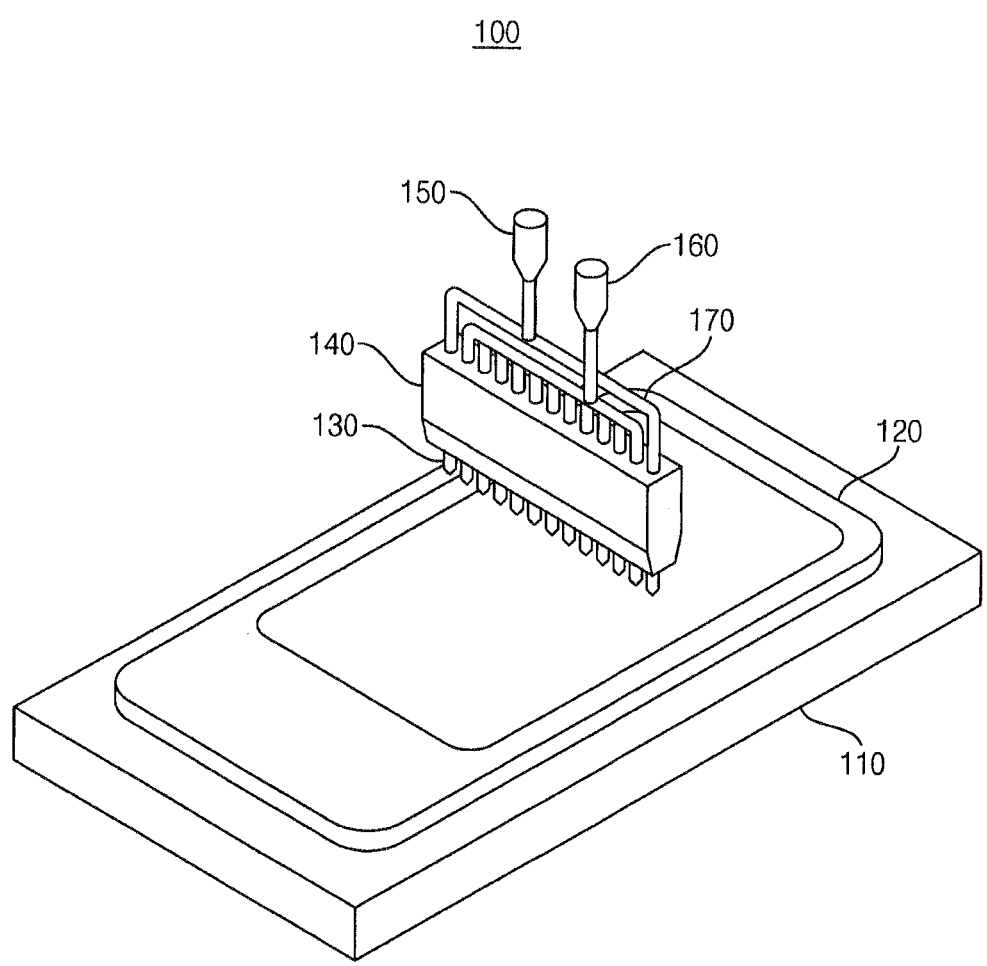
FIG. 1 is a perspective view illustrating a resin coating apparatus according to an exemplary embodiment of the present invention.

Various exemplary embodiments of the present invention will be described more fully hereinafter with reference to the accompanying drawings. The present invention may, however, be embodied in many different forms and should not be construed as limited to the exemplary embodiments set forth herein. In the drawings, the sizes and relative sizes of certain parts and regions may be exaggerated for clarity. Like numerals may refer to like elements throughout.

It will be understood that when an element is referred to as being "connected" or "coupled" to another element, it can be directly connected or coupled to the other element or intervening elements may be present. As used herein, the singular forms "a," "an" and "the" are intended to include the plural forms as well, unless the context clearly indicates otherwise.

Figure 2:
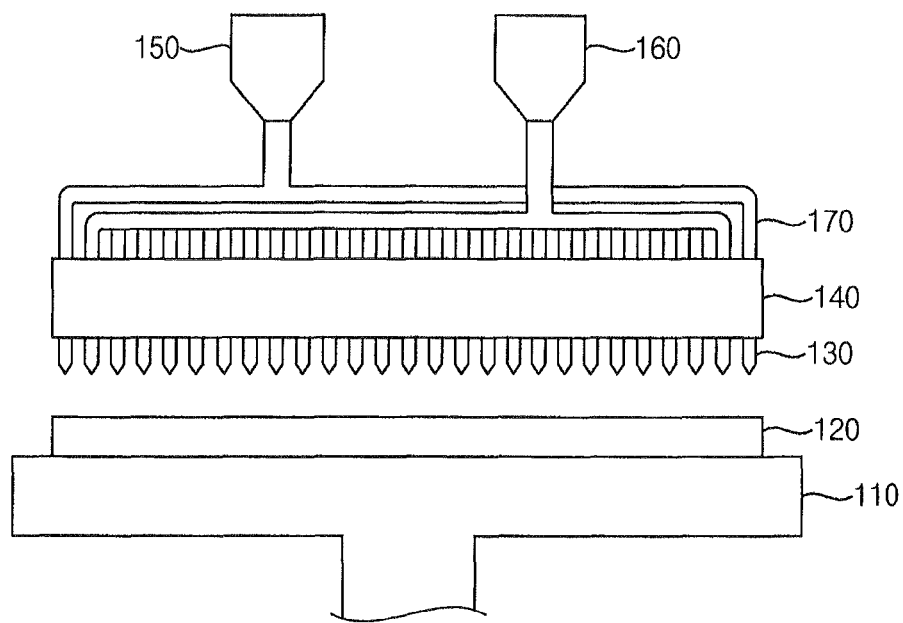
FIG. 2 is a plane view illustrating the resin coating apparatus illustrated in FIG. 1.

FIG. 1 is a perspective view illustrating a resin coating apparatus according to exemplary embodiments of the present invention. FIG. 2 is a plane view illustrating the resin coating apparatus illustrated in FIG. 1.

Referring to FIGS. 1 and 2, a resin coating apparatus 100 includes a stage 110, a display panel 120, a plurality of nozzles 130, a connecting member 140, a first supply unit 150 and a second supply unit 160.

The display panel 120 may be one of, for example, a liquid crystal display panel, a plasma display panel or an organic light emitting diode display panel. A flat display device may be implemented by the display panel 120 which is bonded with a cover member. The cover member may comprise a touch panel or a window panel. A type, a size and a thickness of the resin which is coated on the display panel 120 may be implemented according to a size and/or a type of the cover member which is bonded with the display panel 120.

The stage 110 may support the display panel 120 in the resin coating process. A structure of the stage 110 may be manufactured in various shapes and sizes according to, for example, the shape and the size of the display panel 120.

The plurality of nozzles 130 may be disposed opposite the stage 110. The nozzles 130 discharge the resin to the display panel 120. The plurality of nozzles 130 receive the resin which stored in the supply units 150 and 160. The supply units 150 and 160 may be disposed on a top side of the resin coating apparatus 100. The nozzles 130 discharge the resin to the display panel 120. Each of the nozzles 130 may discharge different types of resin according to the type of resin held in the supply units 150 and 160 which are connected with the nozzles 130 through a pipe 170.

The plurality of nozzles 130 may be arranged in a row and be fixed to the connecting member 140. When the number of the nozzles 130 are a number n, the first nozzle and the $n^{th}$ nozzle (the last nozzle) may be connected to the first supply unit 150. The second nozzle to the $n-1^{th}$ nozzle may be connected to the second supply unit 160. Thus, the first resin stored in the first supply unit 150 may be coated on the peripheral region of the display panel 120 according to a position of the connected nozzles 130, and the second resin stored in the second supply unit 160 may be coated on the central region of the display panel 120 according to the position of the connected nozzles 130. The number of the nozzles 130 which are connected to the first supply unit 150 is not limited to two nozzles. The number of nozzles 130 which are connected to the first supply unit 150 may be determined by, for example, the size of the nozzles 130, the size of the display panel 120, a property of the resin or a distance of the nozzles 130 from the display panel 120.

The connecting member 140 may hold the nozzles 130 at a desired position. The connecting member 140 may include a plurality of insert holes (e.g., insert holes 142 in FIG. 4B) to insert the nozzles 130. The nozzles 130 may be inserted into the connecting member 140 at various positions according to the process being performed. The sizes of the nozzles 130 may be changed according to the size of the insert holes (e.g., insert holes 142 in FIG. 4B). The number of the nozzles 130 may be changed according to the distance between the nozzles 130.

The connecting member 140 may be connected to a transporting device (not shown). The connecting member 140 may be transported in a longitudinal direction and/or a horizontal direction of the display panel 120 at the top of the resin coating apparatus so that the resin is coated on the display panel 120.

The first supply unit 150 and the second supply unit 160 may store different types of resins. The first resin which may be stored in the first supply unit 150 may be a high viscosity material and the second resin which may be stored in the second supply unit 160 may be a low viscosity material.

As described, the first resin may be coated on the edge of the display panel 120. The first resin may maintain a shape that the nozzles 130 discharge because the first resin may have high viscosity. The first resin forms a dam on the peripheral region of the display panel 120.

On the other hand, the second resin may be coated on the central region of the display panel 120, and the second resin may be dispersed on the display panel 120 as soon as it is coated on the display panel 120 because the second resin may have low viscosity. The dam which is formed by the first resin having high viscosity prevents the second resin having low viscosity from overflowing off of the display panel 120. Thus, a defect which may occur by an overflowing resin may be prevented, and the resin layer may be uniformly formed.

The first supply unit 150 and the second supply unit 160 may be connected with the nozzles 130 through the pipe 170. Each of the supply units 150 and 160 may include a pressing device (not shown) to supply the resin. For example, because the first resin may have high viscosity, the pressing device may be used for the first resin.

Further, a control device (not shown) may be disposed between the supply units 150 and 160 and the pipe 170 or between the pipe 170 and the nozzle 130 to control an amount and a speed of the resin being discharged.

As described, the resin layer which has a uniform thickness may be formed using the resin coating apparatus 100 while the first resin and the second resin are discharged at the same time. Two different types of resins may be coated on the display panel. The two different types of resins may, for example, have different viscosities. The two different types of resins may be deposited on the display panel at the same time. An additional process of coating the two different types of resins may not be required.

Figure 3:
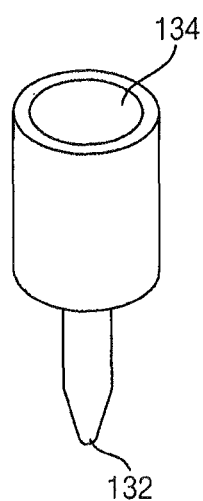
FIG. 3 is a perspective view illustrating a nozzle of the resin coating apparatus illustrated in FIG. 1.

FIG. 3 is a perspective view illustrating a nozzle 130 of the resin coating apparatus 100 illustrated in FIG. 1.

Referring to FIG. 3, the nozzle 130 has an outlet 132 and an inlet 134.

The resin which is provided through the inlet 134 may be discharged to the display panel 120 through the outlet 132. The outlet 132 may have a small hole to discharge the resin to the desired area of the display panel 120.

When two different types of the resins are discharged, a shape of the nozzle may be changed according to a property of the resin. For example, when a high viscosity resin and a low viscosity resin are discharged through outlets which have the same shapes at the same time, an amount of the low viscosity resin discharged from one outlet is larger than the amount of the high viscosity resin discharged from another outlet. Thus, the outlet of the nozzle for the high viscosity resin may be formed wider than that of the outlet of the nozzle for the low viscosity resin so the outlets can discharge the resins at the same time.

The inlet 134 may be coupled to the supply units 150 and 160. The resin which is provided from the inlet 134 may move to the outlet 132. The inlet 134 may have a larger opening than the outlet 132 and may store the resin to provide the resin continuously to the outlet 132.

The nozzle 130 may have various shapes according to the property and the desired shape of the resin, such that it is different from the cylinder-shaped nozzle 130 illustrated in FIG. 3.

Figure 4A:
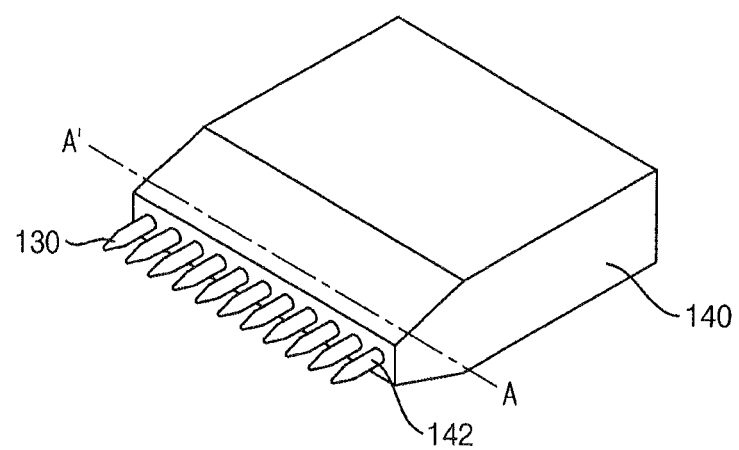
FIG. 4A is a perspective view illustrating a connecting member of the resin coating apparatus illustrated in FIG. 1.
Figure 4B:
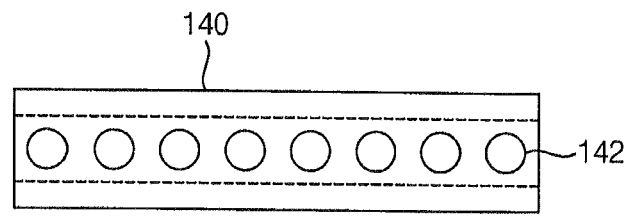
FIG. 4B is a cross-sectional view illustrating a connecting member illustrated in FIG. 4A.
Figure 4C:
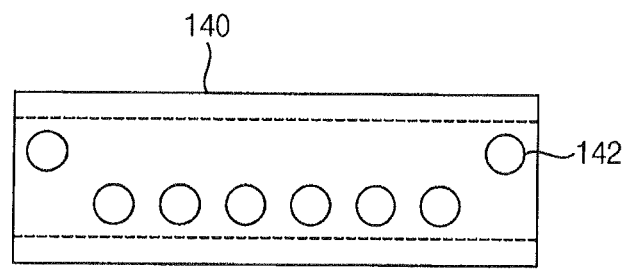
FIG. 4C is a cross-sectional view illustrating a connecting member illustrated in FIG. 4A.

FIG. 4A is a perspective view illustrating a connecting member of the resin coating apparatus 100 illustrated in FIG. 1, FIG. 4B is a cross-sectional view illustrating a connecting member illustrated in FIG. 4A and FIG. 4C is a cross-sectional view illustrating a connecting member illustrated in FIG. 4A.

Referring to FIG. 4A, the plurality of nozzles 130 may be inserted and may be fixed to the connecting member 140. The connecting member 140 may include a plurality of inset holes 142 to insert the plurality of nozzles 130. The number of the plurality of nozzles 130 which are inserted to the insert holes 142 of the connecting member 140 may be determined by the number of the insert holes 142 of the connecting member 140.

A formation position, a size and a shape of the insert holes 142 may be determined by the property of the resin which is discharged to the display panel 120 through the nozzles 130.

Referring to FIG. 4B, the insert holes 142 of the connecting member 140 may be evenly spaced in a row. The arrangement of the insert holes 142 is not limited thereto and the insert holes 142 may be formed in two or more rows and may be unevenly spaced at varied distances (as shown in FIG. 4C.

When the high viscosity resin is discharged through the nozzles 130 which are disposed in a peripheral region of the connecting member 140 and the low viscosity resin is discharged through the nozzles 130 which are disposed in a central region of the connecting member 140, the low viscosity resin may overflow off of the display panel 120 because the discharging speed of the high viscosity resin is slower than the low viscosity resin.

Referring to FIG. 4C, the nozzles 130 which are disposed in the peripheral region of the connecting member 140 may be disposed ahead of the nozzles 130 which are disposed in the central region of the connecting member 140. Thus, the overflow of the low viscosity resin may be prevented (as shown in FIG. 4C).

Figure 5:
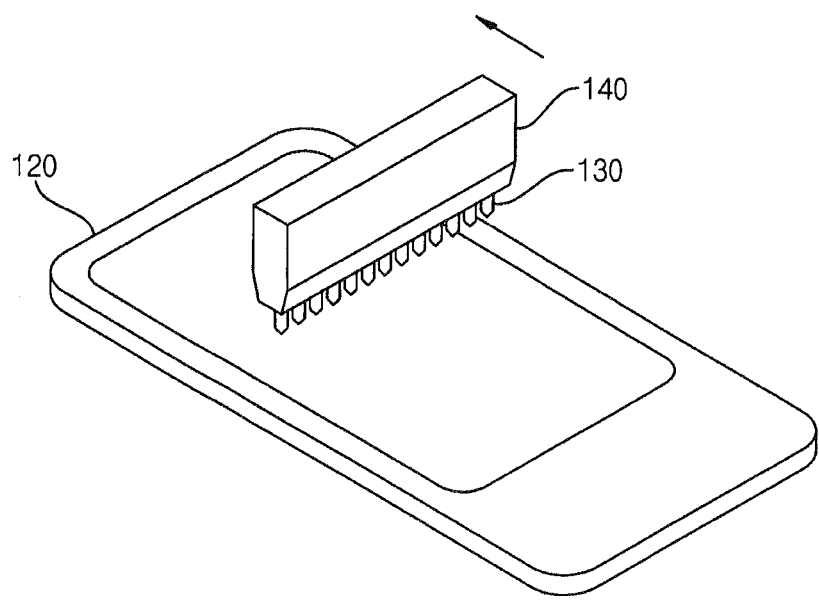
FIG. 5 is a perspective view illustrating a method for coating a resin on a display panel according to an exemplary embodiment of the present invention.

FIG. 5 is a perspective view illustrating a method for coating a resin on a display panel according to exemplary embodiments of the present invention.

Referring to FIG. 5, the connecting member 140 in which the nozzles 130 are inserted may be transported in a longitudinal direction and a horizontal direction of the display panel 120 so that the resins are coated on the display panel 120. The state of the resin layer may be determined by the transporting speed of the connecting member 140 and the discharging speed of the resin from the nozzles 130.

The transporting speed of the connecting member 140 is determined by a transporting device (not shown). When the transporting speed of the connecting member 140 is too fast, the resin might not be evenly coated on the display panel 120. Thus an area of the display panel 120 may not be coated by the resin. Alternatively, when the transporting speed of the connecting member 140 is too slow, a large amount of the resin may be coated on the display panel 120 and the resin may overflow off of the display panel 120. In this case, an area may exist in which the resin is over coated or not coated. Thus, the resin layer which is formed on the display panel 120 might not be uniformly formed. To achieve uniformity, the transporting speed of the connecting member 140 may be constantly maintained according to the property of the resin, for example, the viscosity of the resin.

The discharging speed of the nozzles 130 may be determined by a control device (not shown) which may be disposed between the supply units 150 and 160 and the pipe 170. Alternatively, the discharging speed of the nozzles 130 may be determined by the control device (not shown) which may be disposed between the pipe 170 and the nozzles 130.

When the discharging speed of the nozzles 130 is too slow, the resin might not be evenly coated on the display panel 120. Thus, an area of the display panel 120 might not be coated by the resin. Alternatively, when the discharging speed of the nozzles 130 is too fast, a large amount of the resin may be coated on the display panel 120 and the resin may overflow off of the display panel 120. In this case, an area may exist in which the resin is over coated or not coated. Thus, the resin layer which is formed on the display panel 120 might not be uniformly formed. To achieve uniformity, the discharging speed of the nozzles 130 may be constantly maintained according to the property of the resin, for example, the viscosity of the resin.

As described, maintaining a desired transporting speed of the connecting member 140 and the discharging speed of the nozzles 130 may form a resin layer which has smooth surface and desired thickness.

Figure 6:
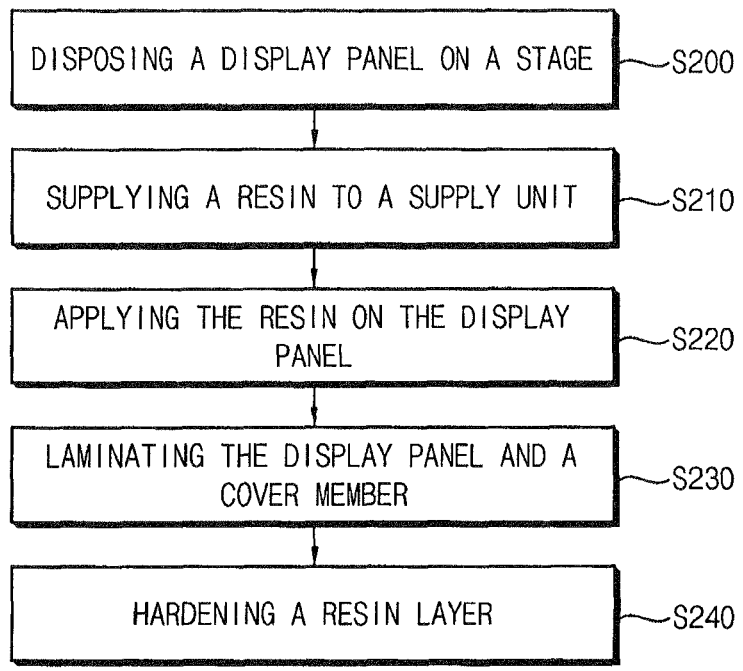
FIG. 6 is a flowchart illustrating a method for coating a resin according to an exemplary embodiment of the present invention.

FIG. 6 is a flowchart illustrating a method for coating a resin according to exemplary embodiments of the present invention.

Referring to FIG. 6, FIG. 1 and FIG. 2, the display panel 120 may be disposed between the nozzles 130 and the stage 110, and the nozzles 130 may be connected to the first supply unit 150 and the second supply unit 160 (S200).

The display panel may be maintained in a clean state from which impurities are eliminated. One side of the display panel which may be bonded with a touch panel or a window panel may be disposed forward of the nozzles 130 of the resin coating apparatus 100.

A first resin may be supplied to the first supply unit 150, and a second resin may be supplied to the second supply unit 160, and the second resin may have a different viscosity from the first resin (S210).

The first resin which has high viscosity may be supplied to the first supply unit 150 and may be connected to the nozzles 130 which may be disposed in the peripheral region of the connecting member 140 through the pipe 170. The second resin which has low viscosity may be supplied to the second supply unit 160 and may be connected to the nozzles 130 which may be disposed in the central region of the connecting member 140 through the pipe 170. When the first resin and the second resin are supplied to the first supply unit 150 and the second supply unit 160, the impurities might not be mixed with the resins. Thus, the resin may be evenly coated on the display panel 120.

The first resin and the second resin may be coated on the display panel 120 by transporting the connecting member 140 which holds the plurality of nozzles 130 (S220).

The connecting member 140 may be transported from a first end to a second end of the display panel 120 to coat the first resin and the second resin on the display panel 120. The connecting member 140 may be transported by a transporting device automatically or manually, and the transporting speed may be controlled by the property of the resin, for example, the viscosity of the resin.

When the first resin and the second resin are coated on the display panel 120, the discharging amount and the discharging speed of the resin may be controlled by a control device.

The control device may be disposed between the first or second supply units 150 or 160 and the pipe 170, or between the pipe 170 and the nozzles 130.

The display panel 120 on which the first resin and the second resin are coated may be bonded with the cover member (S230).

The cover member, for example, the touch panel or the window panel may be bonded on the area of the display panel 120 on which the resin layer is formed. In the bonding process, impurities might not be mixed with the resin layer because the resin is coated on the display area of the display panel 120.

The first resin and the second resin may be hardened (S240).

The first resin and the second resin may be hardened by a ultraviolet ray or heat.

The first resin and the second resin may be thermosetting resins. In this case, the display panel 120 which is bonded with the cover member may be put into a high temperature chamber to harden the first resin and the second resin.

As mentioned, the first resin and the second resin may be hardened by the ultraviolet ray. In this case, the display panel 120 which is bonded with the cover member may be put into a chamber which emits the ultraviolet ray to harden the first resin and the second resin.

Figure 7A:
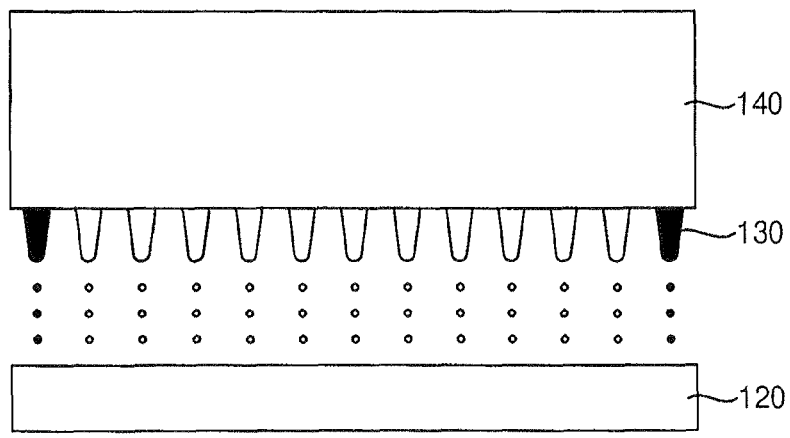
FIGS. 7A through 7C are cross-sectional views illustrating a process of forming a resin layer on a display panel according to an exemplary embodiment of the present invention.
Figure 7B:
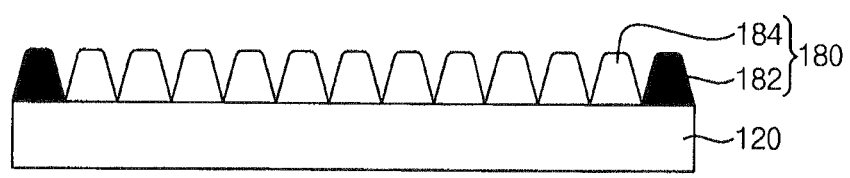
Figure 7C:
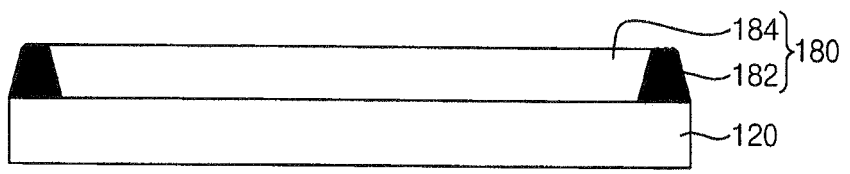

FIGS. 7A through 7C are cross-sectional views illustrating a process of forming a resin layer on a display panel according to exemplary embodiments of the present invention.

Referring to FIG. 7A, a first resin 182 which may be supplied from the first supply unit 150 of the resin coating apparatus 100 may be discharged to the display panel 120 through the nozzles 130. A second resin 184 which may be supplied from the second supply unit 160 of the resin coating apparatus 100 may be discharged to the display panel 120 through the nozzles 130. The first resin 182 may be discharged through the nozzles 130 which may be disposed in a peripheral region of the connecting member 140 and the second resin 184 may be discharged through the nozzles 130 which may be disposed in the central region of the connecting member 140.

Referring to FIG. 7B, the first resin 182 may maintain a deposited shape while the connecting member 140 in which the nozzles 130 are inserted is transported from a first end to a second end of the display panel 120 because the first resin 182 may be a high viscosity material. In the alternative, the first resin may be a liquid.

Alternatively, the second resin 184 may be dispersed on the display panel 120 while the connecting member 140 on which the nozzles 130 are inserted is transported from the first end to the second end of the display panel 120 because the second resin 184 is a low viscosity material.

When the second resin 184 is dispersed onto the display panel 120, the first resin 182 which may maintain the deposited shape may play a role as a dam which may prevent the overflow of the second resin 184 off of the display panel 120.

Referring to FIG. 7C, the second resin 184 may be evenly dispersed between the first resin 182. Thus, a uniform thickness of the resin layer (e.g., resin layer 180 of FIG. 7C) may be formed.

As described, the resin layer having a smooth surface and uniform thickness may be formed using the resin having low viscosity and the resin having high viscosity without having to perform an additional process. The overflow of the resin off of the display panel may be prevented by using the resin having high viscosity. Further, the ability of the display panel to transmit images is thus improved.

While the inventive concept has been particularly shown and described with reference to exemplary embodiments thereof, it will be understood by those of ordinary skill in the art that various changes in form and detail may be made therein without departing from the spirit and scope of the inventive concept as defined by the following claims.

What is claimed is:

1. A resin coating apparatus comprising:
a stage configured to receive a display panel;
a plurality of nozzles corresponding to the stage, each of the nozzles having an outlet configured to discharge a resin onto the display panel, wherein the plurality of nozzles comprise first nozzles and second nozzles, the first nozzles disposed on a peripheral region of a connecting member, and the second nozzles disposed on a central region of the connecting member, wherein the outlets of the first nozzles disposed on the peripheral region of the connecting member have different sizes than the outlets of the second nozzles disposed on the central region of the connecting member;
a first supply unit connected to the first nozzles, the first supply unit configured to supply a first resin; and
a second supply unit connected to the second nozzles, the second supply unit configured to supply a second resin, the second resin having a different viscosity than the first resin.

2. The resin coating apparatus of claim 1, wherein the first nozzles are configured to discharge a resin having a higher viscosity than the second nozzles are configured to discharge.

3. The resin coating apparatus of claim 1, wherein the nozzles are connected to the first supply unit or the second supply unit through pipes.

4. The resin coating apparatus of claim 1, wherein the connecting member comprises insert holes into which the nozzles are inserted.

5. The resin coating apparatus of claim 1, wherein the number of the nozzles is n, and
wherein a first nozzle and an $n^{th}$ nozzle of the nozzles are connected to the first supply unit through a same pipe and the first nozzle and the $n^{th}$ nozzle of the plurality of nozzles are configured to discharge the first resin onto the display panel.

6. The resin coating apparatus of claim 1, wherein the number of the nozzles is n, and
wherein a second nozzle to an $(n-1)^{th}$ nozzle of the nozzles are connected to the second supply unit through a same pipe and the second nozzle and the $(n-1)^{th}$ nozzle are configured to discharge the second resin onto the display panel.

7. The resin coating apparatus of claim 1, wherein the nozzles are arranged in a row.

8. A resin coating apparatus comprising:
a connecting member suspended above a stage, the stage configured to support a display panel, the connecting member comprising a plurality of nozzles configured to discharge a resin onto the display panel, wherein each of the nozzles comprises an inlet and an outlet that is smaller than the inlet;
wherein the plurality of nozzles comprise first nozzles and second nozzles, the first nozzles disposed on a peripheral region of the connecting member, and the second nozzles disposed on a central region of the connecting member, wherein the inlets and outlets of the first nozzles disposed on the peripheral region of the connecting member have different sizes than the inlets and outlets of the second nozzles disposed on the central region of the connecting member;
a first supply unit connected to the first nozzles, the first supply unit configured to supply a first resin; and
a second supply unit connected to the second nozzles, the second supply unit configured to supply a second resin, wherein the first nozzles discharge the first resin having a first viscosity and the second nozzles discharge the second resin having a second viscosity.

9. The resin coating apparatus of claim 8, wherein the first nozzles are configured to discharge a resin having a higher viscosity than the second nozzles are configured to discharge.

* * * * *